(12) United States Patent
Lauchlan

(10) Patent No.: US 7,556,915 B2
(45) Date of Patent: Jul. 7, 2009

(54) PROCESS TO FORM AN ISOLATED TRENCH IMAGE IN PHOTORESIST

(75) Inventor: Laurie Jane Lauchlan, Saratoga, CA (US)

(73) Assignee: Headway Technologies, Inc., Milpitas, CA (US)

( * ) Notice: Subject to any disclaimer, the term of this patent is extended or adjusted under 35 U.S.C. 154(b) by 246 days.

(21) Appl. No.: 11/297,093

(22) Filed: Dec. 8, 2005

(65) Prior Publication Data

US 2007/0134597 A1    Jun. 14, 2007

(51) Int. Cl.
    *G03F 7/26* (2006.01)
(52) U.S. Cl. ............ 430/311; 430/313; 430/5; 430/320; 430/324; 430/331
(58) Field of Classification Search ........... 430/311, 430/5, 320, 324, 313, 331
    See application file for complete search history.

(56) References Cited

U.S. PATENT DOCUMENTS

| 6,258,489 | B1 | 7/2001 | Stanton et al. ............. 430/5 |
| 6,749,972 | B2 | 6/2004 | Yu ........................... 430/5 |
| 6,807,662 | B2 | 10/2004 | Toublan et al. .......... 716/21 |
| 2002/0019305 | A1* | 2/2002 | Wu ........................ 501/56 |
| 2002/0037476 | A1* | 3/2002 | Kamijima ............. 430/311 |
| 2003/0013309 | A1* | 1/2003 | Trivedi ................. 438/700 |
| 2004/0241557 | A1 | 12/2004 | Bellman et al. .......... 430/5 |

* cited by examiner

*Primary Examiner*—Mark F Huff
*Assistant Examiner*—Caleen O Sullivan
(74) *Attorney, Agent, or Firm*—Saile Ackerman LLC; Stephen B. Ackerman

(57) ABSTRACT

An isolated hole in a photoresist layer is formed by surrounding it with additional, somewhat narrower, dummy hole features. The ratio of feature width to resist thickness is adjusted so that, after development, there is no resist on the floor of the isolated (main) hole whereas a reduced, but finite, thickness of resist remains on the floors of the holes derived from the dummy features. The isolated hole may then be used for etching or electroplating the underlying substrate.

14 Claims, 2 Drawing Sheets

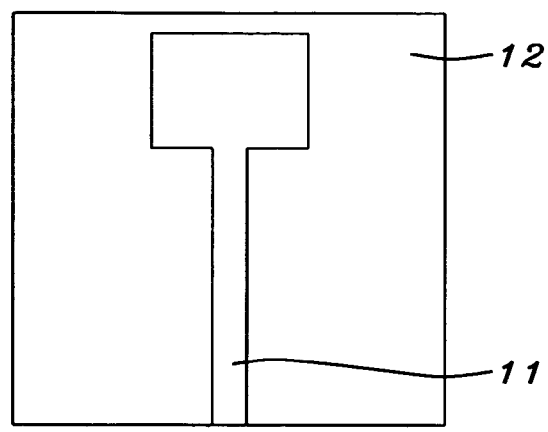
FIG. 1 - Prior Art
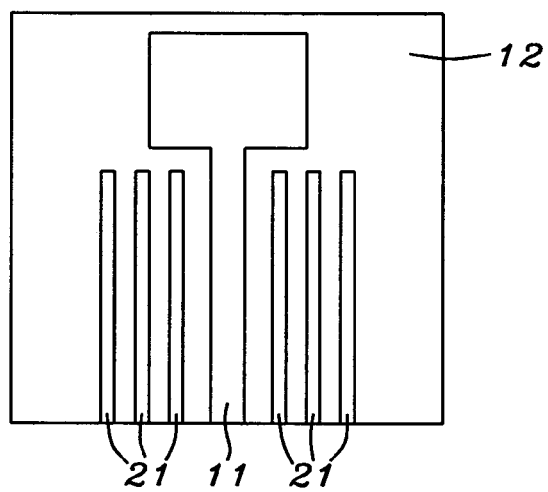
FIG. 2
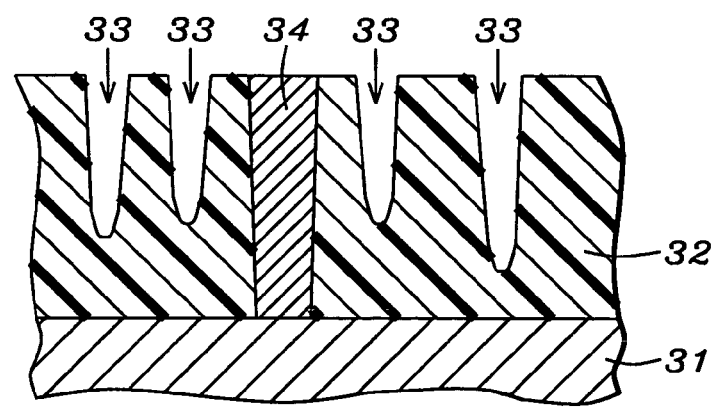
FIG. 3

PROCESS TO FORM AN ISOLATED TRENCH IMAGE IN PHOTORESIST

FIELD OF THE INVENTION

The invention relates to the general field of photolithographic processes with particular reference to isolated hole features and the manufacture of magnetic write heads.

BACKGROUND OF THE INVENTION

In the manufacture of thin film recording heads, the lithographic step that defines the write head is considered to be a critical one. The challenge of this process is to resolve a small physical dimension while maintaining tight width and shape control in a thick photoresist imaging layer. Specifically, said small dimension is the three dimensional patterning control of the isolated pole structure, namely the physical width and shape control over several microns in height, which poses the greatest challenge for this process. As the design rule target for the write magnetic track width continues to decrease, it becomes more and more important to maintain sufficient process margin, i.e. minimize CD (critical dimension) variation and maintain shape control through dose and defocus, in order to achieve the required pole geometries.

Several resolution enhancement techniques, such as phase shifting masks (PSM), optical proximity correction (OPC), and off-axis illumination have been shown to improve the process window for thin resist applications over that obtained using binary masks with conventional illumination techniques. The PSM methods can improve both the resolution and the process latitude for iso-(dense) line features imaged in thin photoresist. However, for thick resist applications, specifically iso-trench designs of the type with which the present invention is concerned, these benefits may be offset by unacceptable resist loss caused by the partial light transmission in the PSM mask design.

OPC masks are less expensive to manufacture than PSM masks, but the design and qualification of sub-resolution features can be problematic. Additional qualification iterations are not uncommon especially when changes in the device shape and/or size are required. Off-axis illumination typically works well for semi-dense to dense structures, but does not significantly increase the depth of focus for isolated features.

In this invention, a technique combining resolution enhancement techniques and off-axis illumination techniques has been shown to significantly improve the process metric for width and shape control. The technique is fully compatible with current manufacturing processes and can be implemented without generating additional integration issues.

FIG. 1 shows a typical design of a binary mask 12 for the write track width layer. The isolated clear area 11 seen in the figure defines the critical write track width. When light passes through the chrome free areas on the reticle, photochemical and thermal reactions in the photoresist enable the photoresist to be developed away, creating a mold-shaped isolated resist stencil. A metal film is then plated inside this mold to form the write pole. Manufacturing robustness for this process demands that the straight portion of the iso-trench resist profile be as high (or tall) as possible in order to accommodate many different plating thickness targets and alternate pattern transfer applications.

A routine search of the prior art was performed with the following references of interest being found:

U.S. Pat. No. 6,749,972 (Yu) discloses an optical proximity correction method including adding scattering bars or anti-scattering bars and off-axis illumination. U.S. Pat. No. 6,807,662 (Toublan et al) describes adding an assist feature to enhance resolution in an isolated area. U.S. Patent Application 2004/0241557 (Ballman et al) teaches a mask having additional features. Off-axis illumination is mentioned.

U.S. Pat. No. 6,258,489 (Stanton et al) shows dummy features next to isolated or closely-packed features to equalize proximity effects. The resist is not fully etched through in the dummy features. In other words, since the dummy feature represents an opening in the resist, said dummy feature is not present in the developed pattern. Stanton et al. achieve this by giving the dummy feature the shape of a narrow frame. The outer edge of this frame continues to provide the out-of-phase diffraction fringes that are needed for OPC but the frame itself is too narrow to be resolved by the system so is absent from the photoresist image. Thus, this is the extension of the notion of scattering bars (which are single lines) from one dimension to two dimensions As will be seen below, the present invention solves the problem in a different way.

SUMMARY OF THE INVENTION

It has been an object of at least one embodiment of the present invention to provide a method to form an image of an isolated hole feature in a layer of photoresist.

Another object of at least one embodiment of the present invention has been to use said method as part of a process for forming a photoresist mold suitable for electroplating applications.

Still another object of at least one embodiment of the present invention has been to apply said process to the manufacture of a magnetic write pole.

These objects have been achieved by surrounding said isolated hole feature with additional, somewhat narrower, dummy hole features. The ratio of feature width to resist thickness is adjusted so that, after development, there is no resist on the floor of the isolated (main) hole whereas a reduced, but finite, thickness of resist remains on the floors of the holes derived from the dummy features. If a conductive substrate was used, it is now possible to electroplate inside the main hole and only the main hole. Once the resist is removed, an isolated raised stricture will have been formed.

BRIEF DESCRIPTION OF THE DRAWINGS

FIG. 1 shows a binary mask of a type used to image a magnetic write pole.

FIG. 2 illustrates how additional dummy features are added to the pattern seen in FIG. 1 in order to improve image quality.

FIG. 3 is a cross-sectional view of a photoresist layer on a conductive substrate that has been exposed to the pattern of FIG. 2, developed and then used as mold during electrodeposition onto said substrate.

DESCRIPTION OF THE PREFERRED EMBODIMENTS

Figure 4:
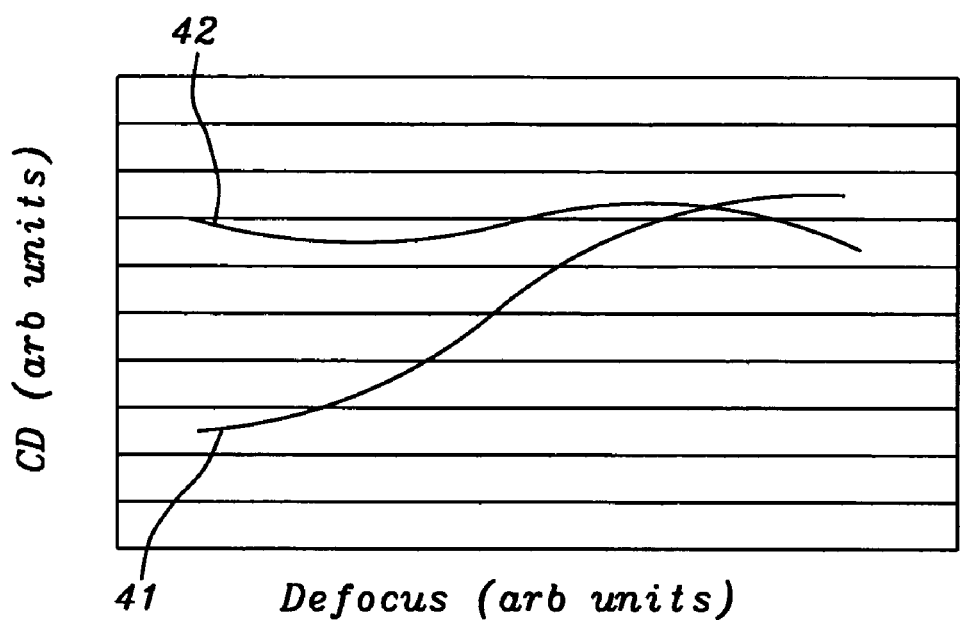
FIG. 4 illustrates how a reduced sensitivity to defocusing is achieved through application of the present invention.

Referring now to FIG. 2, the mask design for the iso-trench lithographic layer is shown. Several additional iso-trench features 21 are added adjacent to the main feature 11 such that the whole pattern behaves more like semi-dense or dense patterns. The design details of the mask design in terms of size, spacing and shape of the additional trenches will, of course, need to be optimized for the available illumination tool and resist type.

For this application, the three-dimensional shape control of the write pole is required for subsequent post-plating processing steps. The straight portion of the main feature is improved with the semi-dense mask design used in conjunction with an off-axis illumination setup on the photo-patterning tool.

FIG. 3 is a cross-sectional image of a test wafer showing the plated main pole structure 34 and the additional trench features 33 patterned into resist 32 which has been deposited on conductive substrate 31. The additional trench structures help to maintain the straight portion of the main pole. The image contrast of the center trench is improved by the introduction of additional patterns. This improved image contrast enhances the three dimensional image integrity and thus the overall process capability is improved.

For a variety of reasons such as depth of focus, loading effects during development, and resist contrast, the vertical sides of a photoresist image will not be truly vertical. So, if one is using the Photoresist to form a mold (as is the case here) the bottom of such a mold will not be free of photoresist if the height of the mold is too great and/or the width of the mold is too narrow. Thus, there is a maximum height-to-width ratio for the Photoresist image above which the bottom of the mold will not be clear of Photoresist. Typically, we have found this ratio to be about 6:1 so that, for a main feature width of 0.8 microns (measured at the resist top surface), the maximum permissible photoresist thickness will be about 4.8 microns. To avoid inadvertent opening of the dummy features all the way down to the substrate, development is best performed at a temperature of less than about 25° C. for less than about 10 minutes.

It is worth noting that even if the CD of the main feature is as wide as 0.8 microns at the top surface of the resist, typically it is less than 0.3 microns at the bottom. The CD at the bottom is the primary interest for thin film head manufacture since it defines the write width of the of the magnetic write head. Thus the effective aspect ratio of the resist trench in the above example is around 16:1. This is very difficult to achieve when using conventional photolithography but becomes relatively easy when the approach taught by the present invention is followed.

Since the additional trench resist structures do not clear completely to the bottom of the resist, the subsequent plating or deposition process does not fill these partially opened patterns. Thus the formation of an isolated pedestal is achieved and subsequent process steps are unaffected. It will therefore be understood that the dummy features used by the present invention differ from conventional scattering bars in that whether or not they appear in the developed photoresist image is of no importance.

FIG. 4 shows the improvement in width control using the design structure of the invention (curve 42) in place of conventional photo-patterning techniques (curve 41). The decrease in sensitivity to defocusing provides the required improvement in both CD and shape control for this application.

Figure 5:
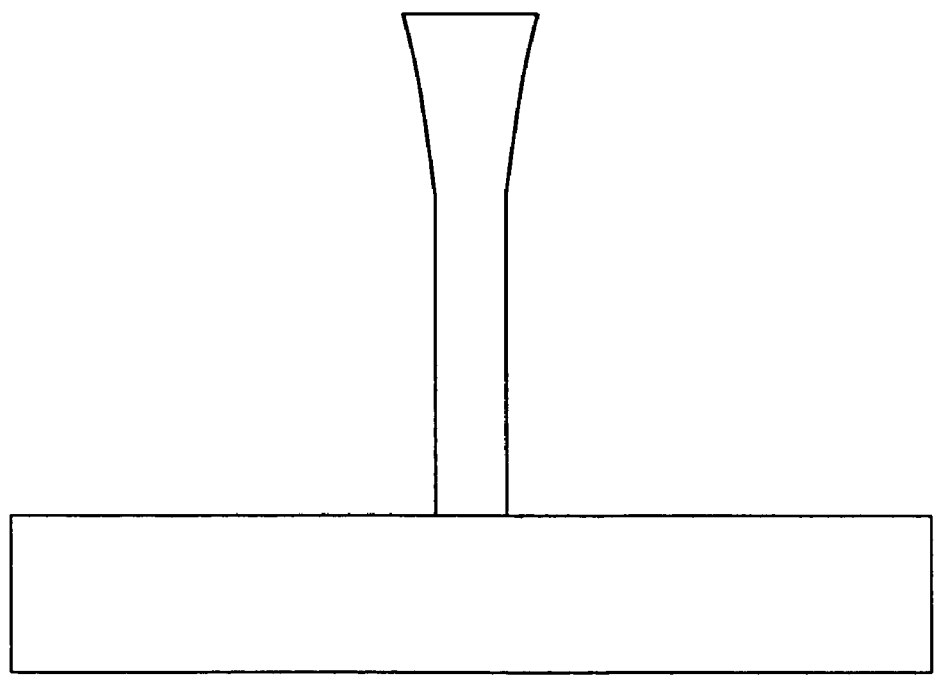
FIG. 5 is cross-section of a typical product formed according to the invention.

FIG. 5 is a schematic cross-section of a magnetic write head, showing the portion that was produced according to the teachings of the present invention.

We can now summarize the advantages of the Invention as follows:

1. Compatibility: The invention is compatible with current write head manufacturing processes and can be implemented with minimal change to the latter.

2. Flexibility: The design of the additional features can be adjusted according to the available resist type and the illumination options such as dipole or quadrupole pupils for process optimization.

3. Extensibility: For ultra-small resolution requirements, this invention can also be implemented with PSM techniques. Appropriate sizing and mask optimization may be required as the target and shape CD requirements are modified.

What is claimed is:

1. A method to form, in a layer of photoresist having a thickness, an image of an isolated hole feature having a first width, comprising:

providing a binary pattern that comprises said isolated feature;

modifying said pattern by adding thereto additional hole features that are located parallel to, and a distance from, each edge of said isolated feature, each of said additional features representing a hole having a second width that is less than said first width;

exposing said layer of photoresist to an binary image of said modified pattern whereby image contrast of said isolated feature is increased; and then developing the photoresist for a time period selected so that a zero thickness of photoresist remains within said isolated hole image and a finite thickness of photoresist remains within said additional hole images due to loading effects that occurred during said selected development time period.

2. The method recited in claim 1 wherein said photoresist thickness and said first width have a relative ratio of not more than between about 6 and 20 to 1.

3. The method recited in claim 1 wherein said photoresist thickness and said second width have a relative ratio of not less than between about 8 and 30 to 1.

4. The method recited in claim 1 wherein said photoresist thickness is between about 1 and 10 microns.

5. The method recited in claim 1 wherein said photoresist is a positive type photoresist.

6. The method of claim 5 wherein said photoresist is developed at a temperature of less than about 25° C. and said selected time period is no more than about 10 minutes.

7. A method to electroform an isolated structure having a first width, comprising:

providing an electrically conductive substrate;

providing a pattern that comprises an image of said structure;

modifying said pattern by adding thereto additional features that are located parallel to, and a distance from, each edge of said isolated structure's image, each of said additional features representing a hole having a second width that is less than said first width;

depositing a layer of photoresist, having a thickness, on said substrate;

exposing said layer of photoresist to an binary image of said modified pattern whereby image contrast of said isolated feature is increased;

developing the photoresist for a selected time period whereby images of all features are formed in said layer of photoresist;

all photoresist having been removed from within said isolated structure image and, due to loading effects during development for said selected time period, a reduced thickness of photoresist remaining within said additional hole images;

then immersing the substrate in a plating bath and electrodepositing material from said bath onto all exposed conductive surfaces; and removing all photoresist, thereby forming said isolated structure.

8. The method recited in claim 7 wherein said isolated structure is a magnetic write pole.

9. The method recited in claim 7 wherein said electrodeposited material is a ternary alloy of iron, cobalt, and nickel.

10. The method recited in claim 7 wherein said photoresist thickness and said first width have a relative ratio of not more than between about 6 and 20 to 1.

11. The method recited in claim 7 wherein said photoresist thickness and said second width have a relative ratio of not less than between about 8 and 30 to 1.

12. The method recited in claim 7 wherein said photoresist thickness is between about 1 and 10 microns.

13. The process recited in claim 7 wherein said photoresist is a positive type photoresist.

14. The method recited in claim 13 wherein said photoresist is developed at a temperature of less than about 25° C. and said selected time period is no more than about 10 minutes.

\* \* \* \* \*